United States Patent [19]
Akimoto

[11] Patent Number: 5,974,682
[45] Date of Patent: Nov. 2, 1999

[54] COOLING PROCESS SYSTEM

[75] Inventor: Masami Akimoto, Kumamoto, Japan

[73] Assignee: Tokyo Electron Limited, Tokyo, Japan

[21] Appl. No.: 08/921,016

[22] Filed: Aug. 29, 1997

[30] Foreign Application Priority Data

Sep. 2, 1996 [JP] Japan .................................. 8-231898

[51] Int. Cl.$^6$ .................................................. F26B 19/00
[52] U.S. Cl. .................................. 34/66; 118/724; 34/62; 34/428
[58] Field of Search .......................... 34/428, 429, 443, 34/497, 62, 66, 68, 75, 72; 118/724, 728; 156/345; 414/217, 939

[56] References Cited

U.S. PATENT DOCUMENTS 5,879,461   3/1999   Adams ..................................... 118/724

FOREIGN PATENT DOCUMENTS 2-30194   7/1990   Japan .

*Primary Examiner*—Henry Bennett
*Assistant Examiner*—Pamela A. Wilson
*Attorney, Agent, or Firm*—Oblon, Spivak, McClelland, Maier & Neustadt, P.C.

[57] ABSTRACT

The process system of the present invention has a cooling process portion, a siding portion, and transfer means. The cooling process portion is responsible for applying cooling process to a heated substrate. The siding portion is positioned in an upper side of the cooling process portion and used for temporarily storing the substrate before being subjected to the cooling process. The transfer means loads/unloads the substrate into/from the cooling process portion and the siding portion.

14 Claims, 11 Drawing Sheets

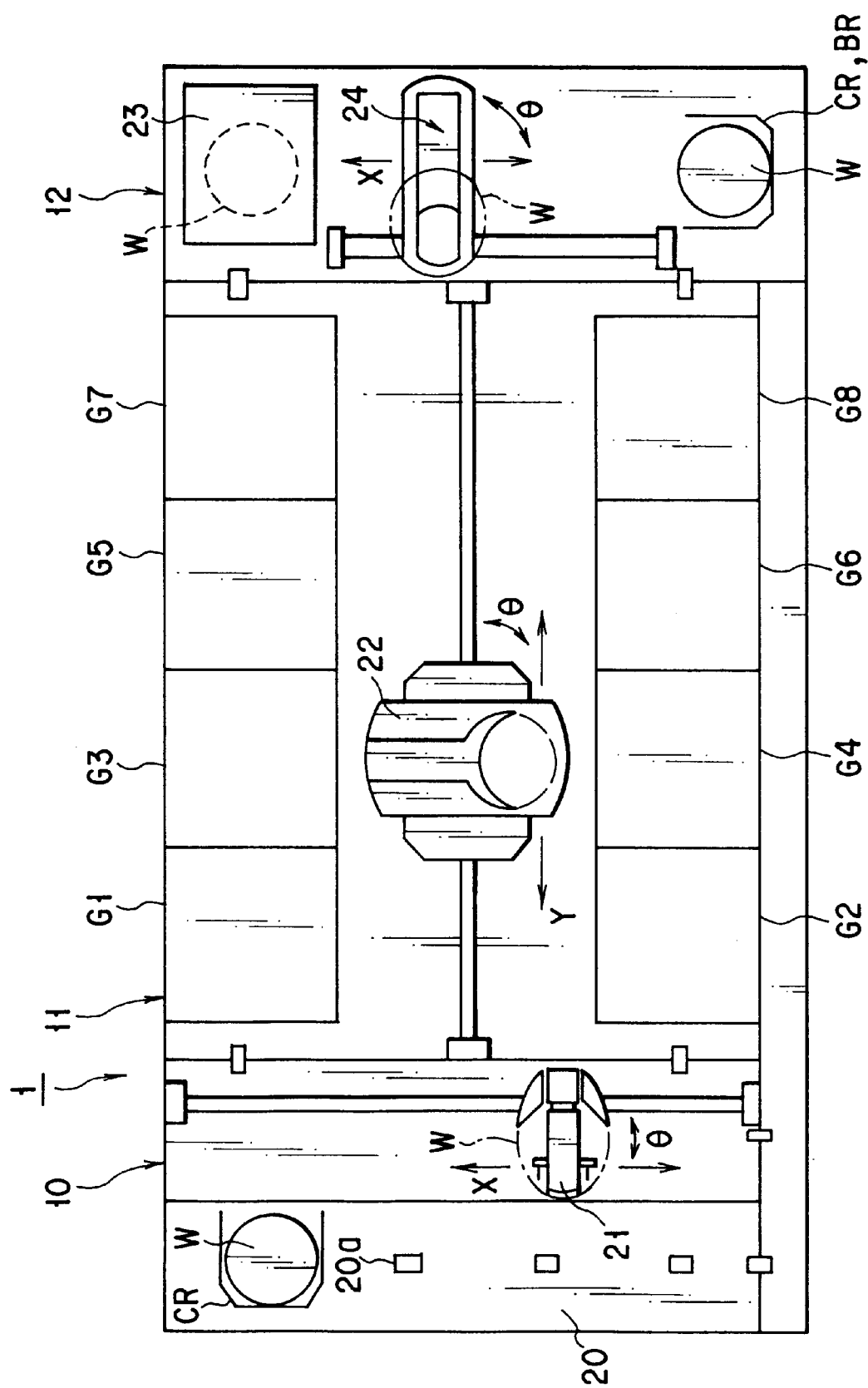
F I G. 2

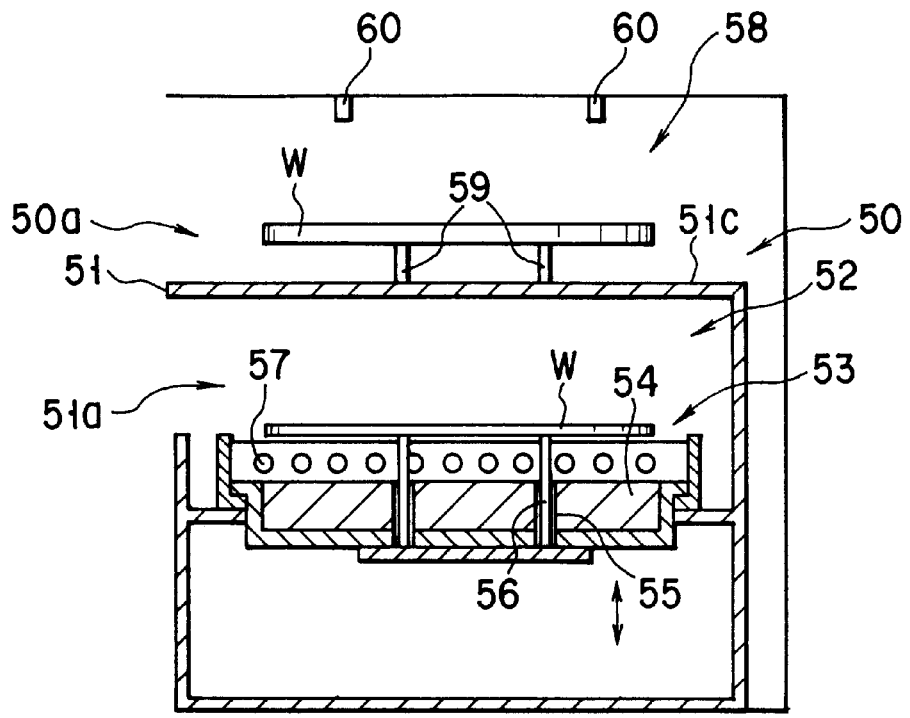
F I G. 7
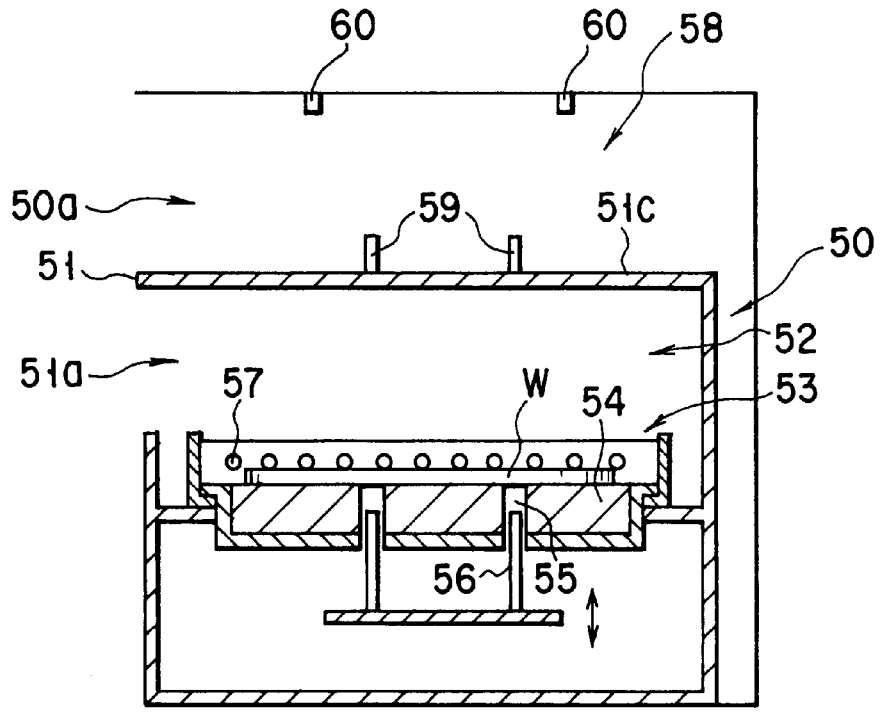
F I G. 8

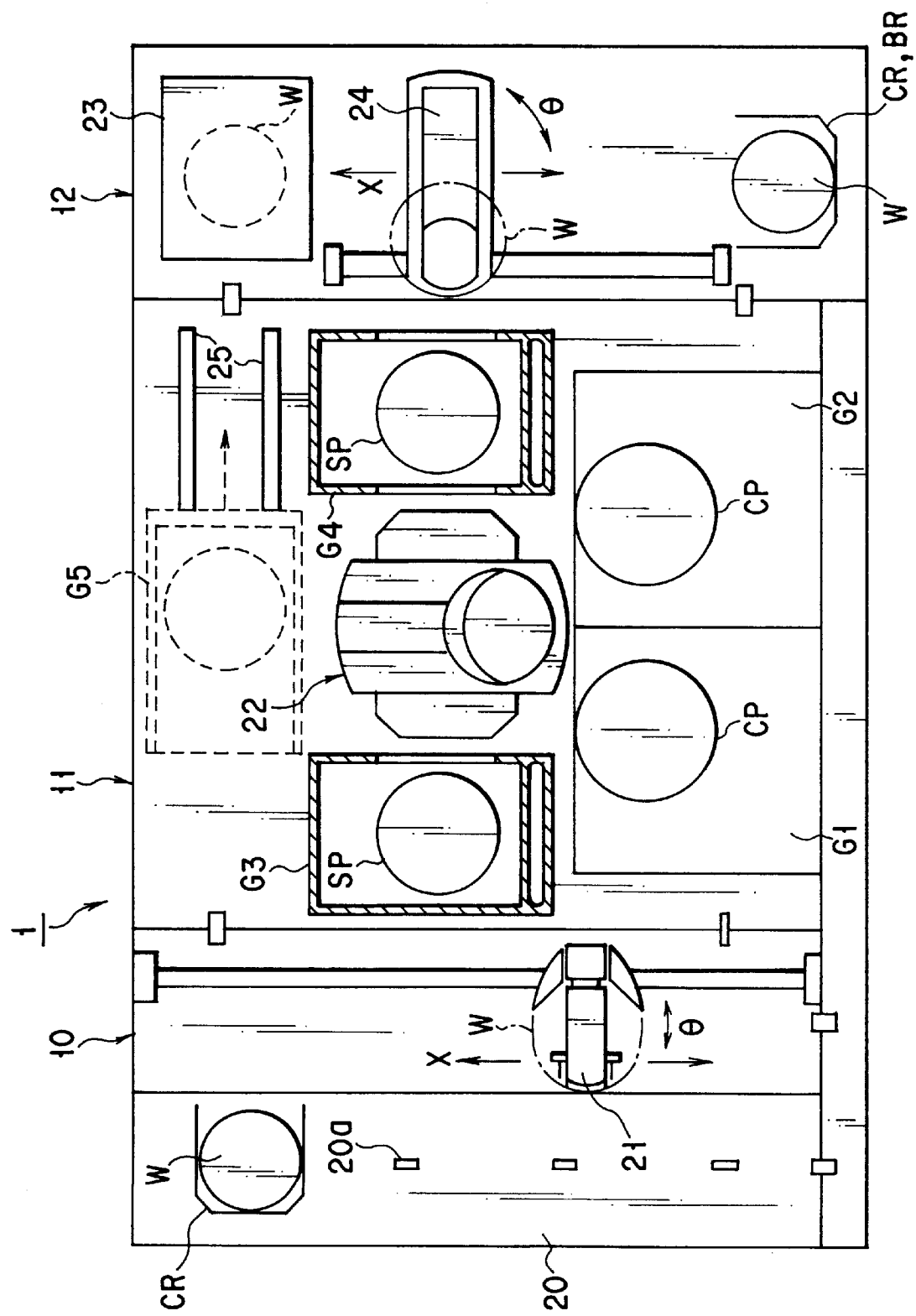
F I G. 15

COOLING PROCESS SYSTEM

BACKGROUND OF THE INVENTION

The present invention relates to a process system for transferring and processing a substrate such as a semiconductor substrate or an LCD substrate.

In the photolithographic step of a semiconductor device manufacturing process, a resist coating process and a developing process are performed. In the resist coating process, a resist film is formed on a surface of a semiconductor wafer (hereinafter, referred to as "wafer"). In the development process, the wafer is developed after the resist-coated wafer is exposed to light. Hitherto, the resist coating process and the developing process have been performed at the corresponding process units assembled in one process system, namely, a complex process system, in accordance with a predetermined sequence, as known in, for example, Jpn. Pat. Appln. KOKOKU publication No. 2-30194.

One example of such a complex process system is shown in FIG. 1. In the resist coating/developing process system 101, the following units are incorporated together: a cassette station 102 for loading/unloading a wafer W into/from a cassette, a brush washing unit 103 for washing the wafer W with a brush, a jet-water washing unit 104 for washing the wafer W with high-pressure jet water 104, an adhesion unit 105 for rendering the surface of the wafer W hydrophobic in order to increase resist-deposition, a cooling unit 106 for cooling the wafer W to a predetermined temperature, a resist coating unit 107 for coating a resist solution on the surface of the wafer W. a heating unit 108 for heating the wafer W before and after the resist coating, a periphery light-exposure unit 109 for removing the resist from the periphery of the wafer W, a wafer-transferring stage 110 for transferring the wafer W to an adjacent light-exposure unit (not shown), and a developing unit 111 for immersing the light-exposed wafer W in a developing solution to dissolve an irradiated potion or a non-irradiated portion, selectively.

In the center of the resist coating/developing process system 101, a corridor-form wafer transfer path 112 is provided in the longitudinal direction (Y-direction). Individual process units are provided with a front face (having a load/unload port) directed to the wafer transfer path 112. The wafer W to be processed is held by a holding member 114 of the wafer transfer apparatus 113, which is movable along the wafer transfer path 112, and then transferred and delivered between the individual units.

The wafer W heated by the heating unit 108 is transferred from the heating unit 108 to the cooling unit 106 by means of the wafer transfer apparatus 113. At the cooling unit 106, the wafer W is cooled to a predetermined temperature and then transferred to the periphery light-exposure unit 109 and the cassette station 102. To describe more specifically, the wafer W applied with a resist solution in the resist coating unit 107 is held by the holding member 114 of the wafer transfer apparatus 113 and unloaded from the unit 107, and then, transferred to the heating unit 108. The wafer W is heated to, for example, 100° C. and unloaded from the unit 108 by the holding member 114 of the wafer transfer apparatus 113, and then, transferred again to the cooling unit 106. In the cooling unit 106, the wafer W is cooled to, for example, 23° C. and transferred to the periphery light-exposure unit 109 by means of the wafer transfer apparatus 113. After development of the wafer W is completed at the developing unit 111, the wafer W is unloaded from the unit 111 by the holding member 114 of the wafer transfer apparatus 113 and transferred to the heating unit 108. The wafer W is heated to, for example, 100° C. The wafer W is then unloaded therefrom by the holding member 114 of the wafer transfer apparatus 113 and transferred to the cooling unit 106. After the wafer W is cooled to, for example, 23° C., the wafer W is transferred to the cassette station 102 by means of the wafer transfer apparatus 113.

However, particularly in a complex process system incorporating various process units together in one place, the wafers W requiring the cooling process assemble at the cooling unit 106 and wait for subjection to the process. In an attempt to avoid this waiting, it is considered possible that the wafers W waiting for the cooling process remain held by the holding member 114 of the wafer transfer apparatus 113. However, since the wafer transfer apparatus 113 must transfer a number of wafers one by one, if the wafer transfer apparatus 113 keeps holding the wafer W as mentioned above, the movement of the apparatus 113 will stop. As a result, the throughput will decrease. Another possibility is that the wafer W waiting for the cooling process is kept in the heating unit 108. However, the excessively long heating time produces adverse effects on the thickness and hardness of the resist film and increases the cooling time.

There is a further possibility that the problem of the number of wafers W waiting for the cooling process is overcome by increasing the number of cooling units 106. However, space is required for those units. Since such a system is usually disposed in a clean room, the increase of space results in a cost increase, producing a significant problem.

BRIEF SUMMARY OF THE INVENTION

An object of the present invention is to provide a process system having a siding portion for temporarily storing a substrate before being subjected to cooling process.

More specifically, the object of the present invention is to provide a process system having a siding portion for temporarily storing a substrate before being subjected to cooling process with no decrease in throughput, no adverse effects on the substrate, and no increase in space cost.

The present invention is directed to attain the aforementioned object without decreasing a cooling rate of the cooling process portion.

The present invention is also directed to attain the aforementioned object with a very simple structure.

Another object of the present invention is to provide a process system capable of reducing cooling processing time.

More specifically, the object of the present invention is to provide a process system capable of actively cooling a substrate waiting for subjection to the cooling process.

Also, the object of the present invention is to provide a process system capable of reducing the cooling processing time by preventing thermal interference between substrates when a plurality of wafers are transferred.

To overcome the aforementioned problems, the process system according to a first aspect of the present invention comprises:

a cooling process portion for applying a cooling process to a substrate;

a siding portion provided in an upper portion of the cooling process portion, for temporarily storing a substrate before being subjected to the cooling process; and transfer means for loading/unloading the substrate into/from the cooling process portion and the siding portion.

In this process system, a siding portion is provided for temporarily storing a substrate before being subjected to the cooling process. Therefore, when a number of wafers requiring cooling process are assembled at the cooling process and wait for subjection to the process, the wafers can be temporarily stored in the siding portion. Thus, the wafer waiting to undergo the cooling process is not needed to leave at a heating process portion or a holding portion of the transfer means. As a result, no adverse effects are produced on the substrate and the throughput will not decrease. Furthermore, it is not necessary to increase the number of process units. Therefore, the space cost can be suppressed. In addition, the siding portion is positioned in the upper side of the cooling process portion, so that a relatively-high temperature substrate can be placed at the upper side and a relatively low temperature substrate can be placed at the lower side of the cooling process portion. In this construction, thermal interference between the siding portion and the cooling process portion will be avoided. As a result, the cooling rate of the cooling process system will not be lowered.

The process system according to a second aspect of the present invention comprises:

a cooling process portion for applying cooling process to a substrate;

a covering member for covering an upper portion of the cooling process portion;

a siding portion provided on the upper surface of the cover member, for temporarily storing the substrate before being subjected to the cooling process; and transfer means for loading/unloading the substrate into/from the cooling process and the siding process.

In this process system, the siding portion is provided on the upper surface of the covering member in order to prevent particles or the like from entering the cooling process unit. The same advantages as those of the process system according to the first aspect of the present invention can be attained by the process system having a quite simple structure.

A process system according to a third aspect of the present invention comprises:

a cooling process portion for applying cooling process to a substrate by use of an inert gas for cooling;

a covering member for covering an upper portion of the cooling process portion;

a siding portion provided on the upper surface of the cover member, for temporarily storing the substrate before being subjected to the cooling process while the substrate is exposed to an inert gas for cooling branched from that used in the cooling process portion; and transfer means for loading/unloading the substrate into/from the cooling process and the siding process.

In this process system, since the substrate stored in the siding portion is exposed to the inert gas for cooling, the substrate is actively cooled also in the siding portion. Hence, the substrate before being subjected to the cooling process system is considerably cooled, with the result that processing time at the cooling process system can be reduced. The system according to the third aspect of the present invention, of course, has the same advantages as those of the first and second process systems.

A process system according to a fourth aspect of the present invention comprises:

a cooling process portion for applying cooling process to a substrate;

a siding portion provided in the upper portion of the cover member, for temporarily storing the substrate before being subjected to the cooling process; and transfer means having upper and lower holding members movable into and out of the cooling process portion and the siding portion.

The upper holding member is responsible for loading the substrate into the cooling process portion. The lower holding member is responsible for unloading the substrate from the cooling process portion.

This process system has a siding portion for temporarily storing the substrate before being subjected to the cooling process. Therefore, when a number of substrate are assembled at the cooling process and wait for cooling process, the substrate can be temporarily stored in the siding portion, so that it is not necessary to leave the substrate in the heating process portion or the holding member of the transfer means until the substrate is subjected to the cooling process. The substrate will have no adverse effects and the throughput will not decrease. In addition, the number of cooling process units is not needed to increase. It is therefore possible to suppress a space cost. Moreover, since the siding portion is positioned in the upper side of the cooling process portion, a relatively high-temperature substrate is placed at the upper side and a relatively low-temperature substrate is placed at the lower side of the cooling process portion. As a result, thermal interference between the siding portion and cooling process portion will be avoided and thus the cooling rate of the cooling process system will not be lowered. In addition, in the present invention, the high-temperature substrate is loaded into the cooling process portion by use of the upper holding member and the low-temperature substrate is unloaded from the cooling process portion by the lower holding member. Hence, it is possible to avoid thermal interference between substrates held by the upper and lower holding members. Consequently, the cooling processing time of the substrate can be reduced. It is also possible to prevent an increase in temperature of the substrate after the cooling process.

A process system according to a fifth aspect of the present invention comprises:

a cooling process portion for applying cooling process to a substrate;

a siding portion provided in the upper portion of the cover member, for temporarily storing the substrate before being subjected to the cooling process; and transfer means having an upper holding member, a middle holding member, and a lower holding member movable into and out of the cooling process portion and the siding portion.

The upper holding member loads the substrate into the siding portion or the cooling process portion. The middle holding member transfers the substrate from the siding portion to the cooling process portion. The lower holding member unloads the substrate from the cooling process portion.

In this process system, the upper holding member loads a high-temperature substrate into the cooling process portion, the middle holding member transfers a middle-temperature substrate from the siding portion to cooling process portion, and the lower holding member unloads a low-temperature substrate from the cooling process portion. Therefore, thermal interference between substrates held by the upper, middle and lower holding members can be avoided. As a result, the cooling process time of the substrate can be reduced. It is also possible to prevent an increase in temperature of the substrate after the cooling process.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a plan view of an entire construct of a coating/developing process system in which an embodiment of the present invention is adopted;

FIG. 7 is a longitudinal sectional view of the cooling unit (COL) shown in FIG. 6;

FIG. 8 is another longitudinal sectional view of the cooling unit (COL) shown in FIG. 6;

FIG. 15 is a plan view of an entire construct of the coating/developing process system of the semiconductor wafer according to another embodiment of the present invention;

DETAILED DESCRIPTION OF THE INVENTION

Hereinbelow, embodiments of the present invention will be explained with reference to the accompanying drawings.

Figure 1:
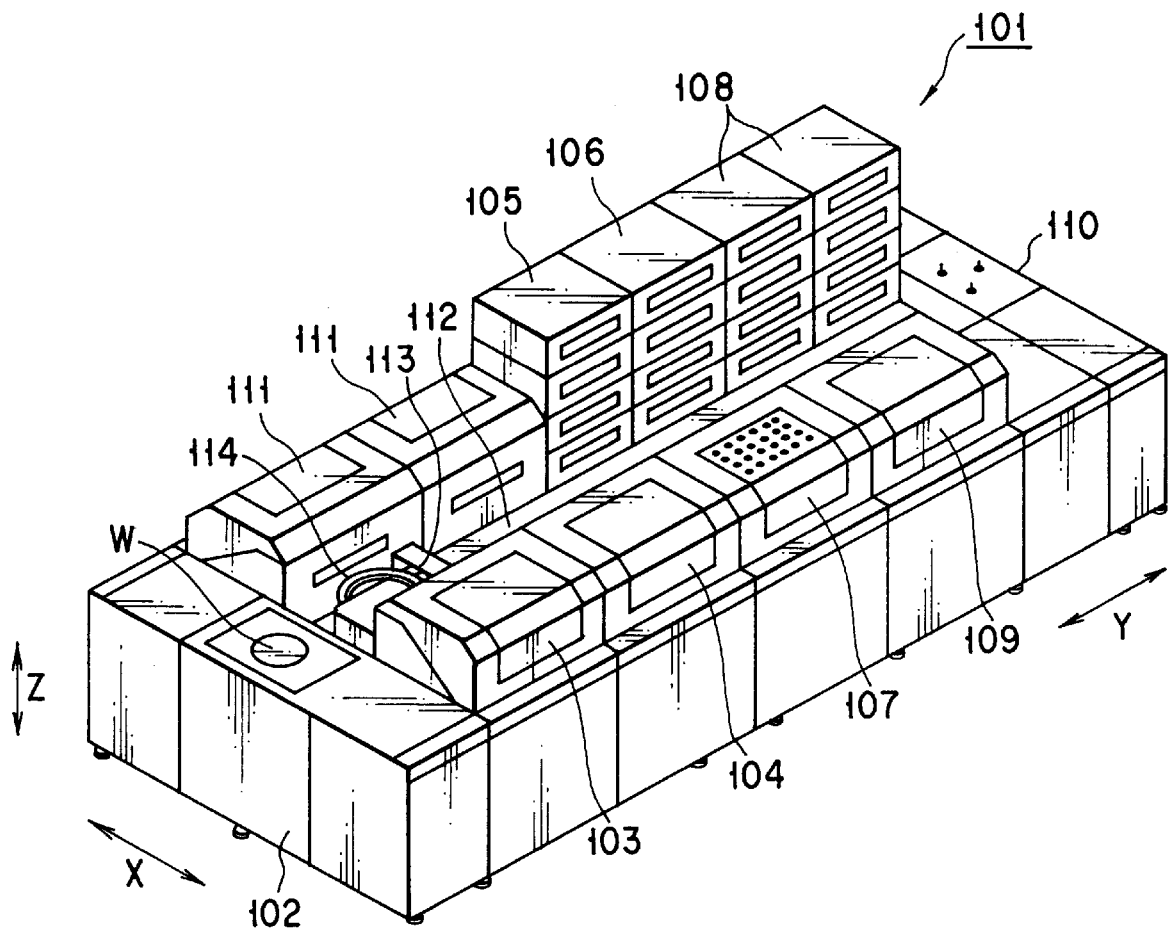
FIG. 1 is a perspective view of a conventionally-used coating/developing process system.
Figure 3:
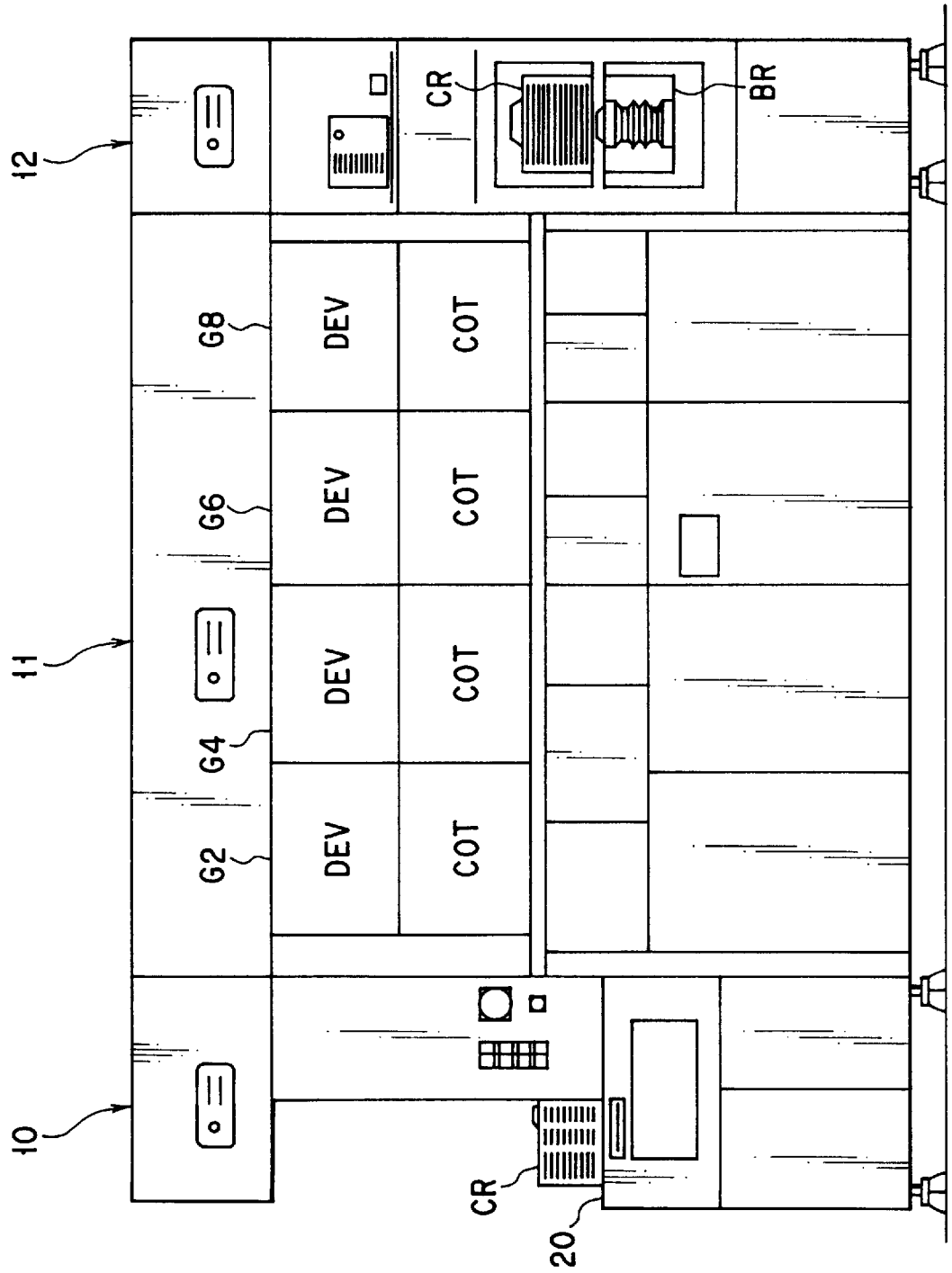
FIG. 3 is a front view of the coating/developing process system shown in FIG. 2.
Figure 4:
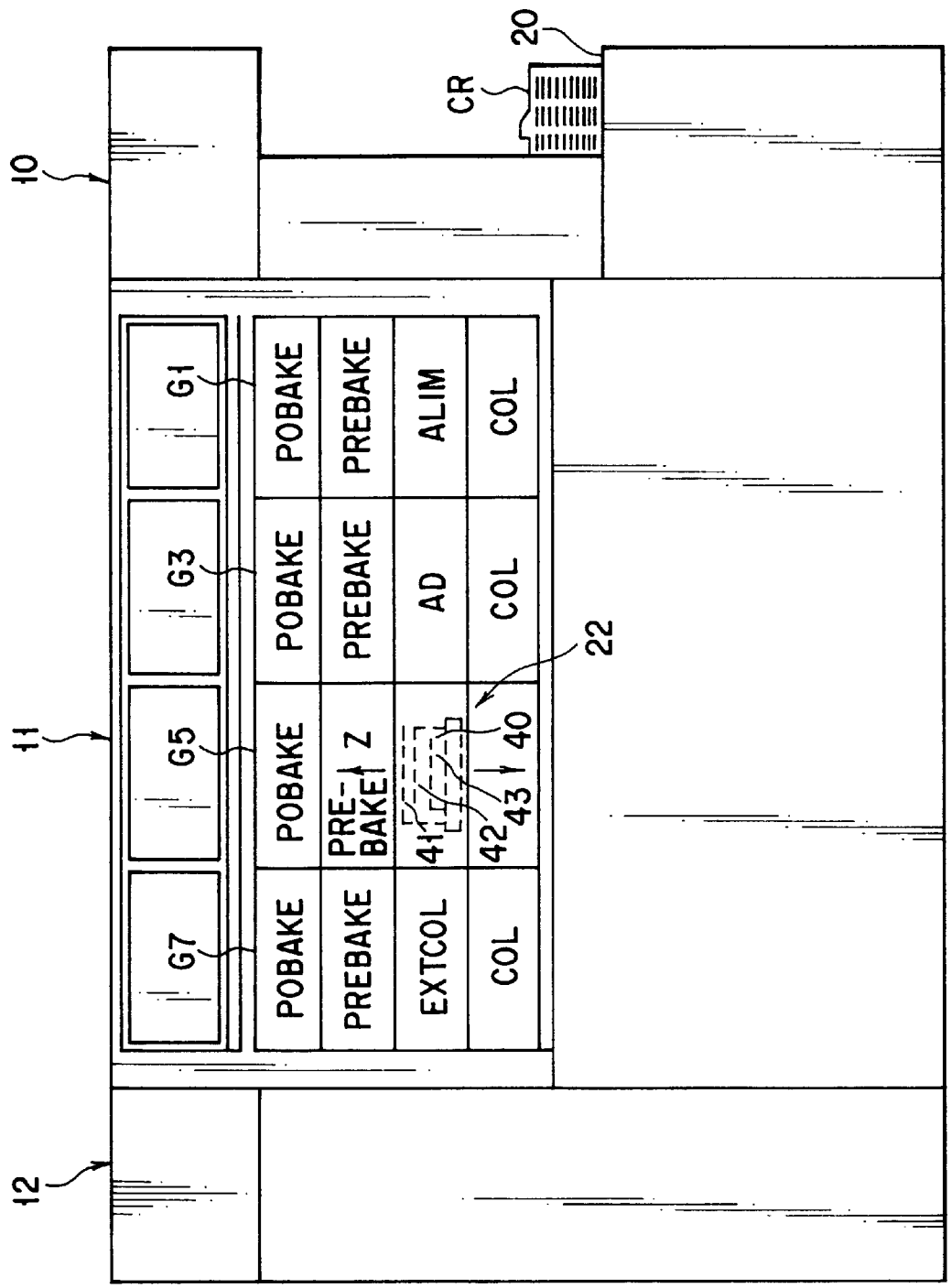
FIG. 4 is a rear view of the coating/developing process system shown in FIG. 2.

The coating/developing process system 1 shown in FIGS. 2–4 comprises a cassette station 10, a process station 11 and an interface portion 12. They are connected to each other contiguously. The cassette station 10 is used for transferring a wafer cassette CR containing a plurality of wafers W (e.g., 25) into the system from outside, and vice versa, and is also used for loading/unloading wafers W into/from the wafer cassette CR. The process station 11 comprises various single wafer processing units arranged at predetermined positions in the form of multiple-stage vertical array. In the various processing units of the coating/developing system, predetermined processes are applied to wafers one by one. In the interface portion 12, the wafer W is transferred into or from the light-exposure device (not shown) provided next to the process station 11.

In the cassette station 10, a plurality of alignment projections 20a (e.g., 4 projections) are formed on a cassette stage 20, as shown in FIG. 2. Each of the wafer cassettes CR is placed on each of the projections 20a in such a way that a wafer loading port faces the process station 11. In this way, the wafer cassettes CR are arranged in line in the X direction (vertical direction of FIG. 2). A wafer transfer member 21 is movable not only in a cassette arrangement direction (the X direction) but also in an arrangement direction of wafers stored in the wafer cassette CR (the Z direction; vertical direction), thereby selectively accessing each of the wafer cassettes CR.

The wafer transfer member 21 can be rotated in the θ direction, so that it can access the wafer transfer member 22 in the process station 11 as well as the wafer transfer member 21, as will be described later.

On the process station 11, for example, a wafer transfer member 22 is provided for transfer means, as shown in FIG. 2. The wafer transfer member 22 can be moved in the horizontal direction (Y direction) between the cassette station 10 and the interface portion 12. On both sides of the wafer transfer member 22, a plurality of sets of process units are arranged in a multiple vertical array. One set of process units arranged in the multiple vertical array is referred to as "process-unit group".

The wafer transfer member 22 of the process station 11 is constructed so that it can move in the Z direction and rotate in the θ direction. The wafer transfer member 22 can access individual process units and a wafer transfer member 24 of the interface portion 12 (described later) other than the aforementioned wafer transfer member 21 of the cassette station 10.

Figure 5:
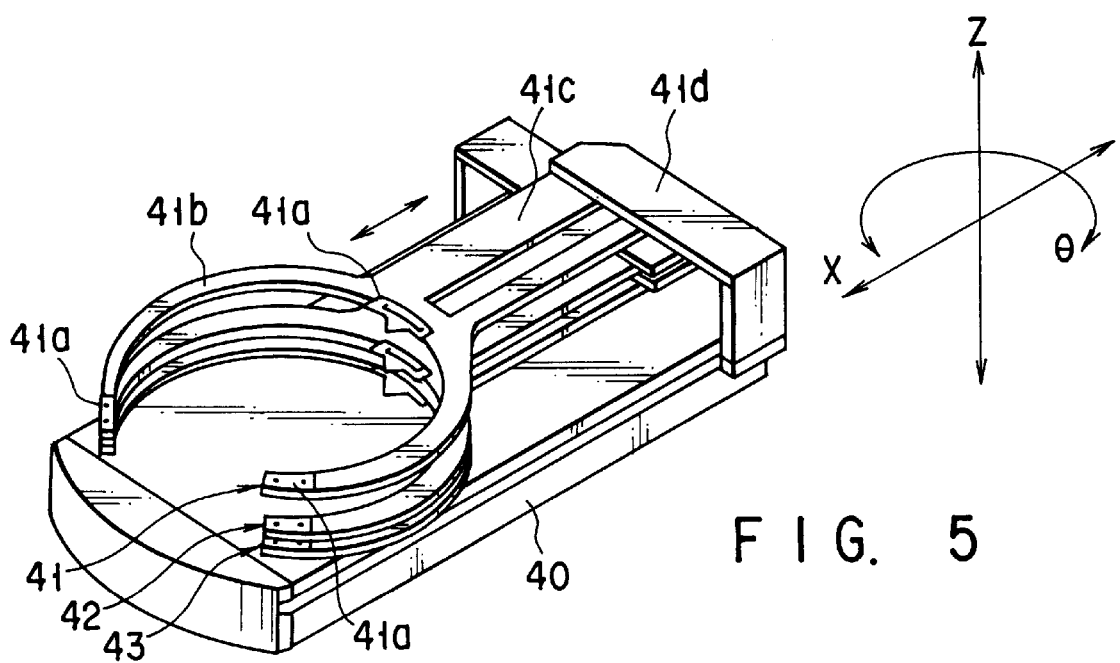
FIG. 5 is a perspective view of a wafer transfer member of the process station shown in FIG. 2.

The wafer transfer member 21 comprises a plurality of holding members such as three pairs of tweezers (41, 42, 43) movable in the back and forth directions on the transfer base table 40. The wafer W is transferred between the wafer transfer member and each process unit by means of tweezers 41, 42 and 43. The structures of the tweezers 41, 42 and 43 are basically identical. The structure of the tweezers will be explained below by taking the uppermost tweezers 41 as an example. As shown in FIG. 5, the pair of tweezers is constituted of three supporting members 41a for directly supporting a wafer W at three peripheral portions, a holding portion 41b of virtually ¾ circular form (U-shape) for holding the wafer W, and a supporting portion 41c for supporting a holding portion 41b. The supporting portion 41c is formed contiguously to the center portion of the holding portion 41b. The entire pair of tweezers 41 is slid in back and forth directions on the transfer base table 40 by means of a stay 41d (provided on the supporting portion 41c) which is driven by a driving motor (not shown). The back and forth movement of the tweezers (41, 42, 43) is controlled by a control unit (not shown) constituted of, for example, a computer.

The tweezers (41, 42, 43) are arranged as shown in FIG. 5. That is, the interval between the uppermost tweezers 41 and the second tweezers 42 is larger than that between the second tweezers 42 and the lowermost tweezers 43. This arrangement prevents thermal interference between wafers W held by the uppermost tweezers 41 and the second tweezers 42. Adverse effects on processing will be prevented by this arrangement. However, the tweezers may be also arranged at the same intervals.

When the wafer W is transferred to the cooling unit, for example, the uppermost pair of tweezers 41 is used. When the wafer W is transferred from the cooling unit to another unit, the lowermost pair of tweezers 43 is used. When the wafer W is transferred from the siding portion (described later) to the cooling unit, the second pair of tweezers 42 is used. By this arrangement, adverse effects brought about by thermal interference between transferred wafers W will be prevented. To enhance the thermal interference prevention effects, a heat insulation board may be interposed between the uppermost tweezers 41 and the second tweezers 42, or between the second tweezers 42 and the lowermost tweezers 43.

On both sides of the wafer transfer member 22, eight process unit groups (G1, G2, G3, G4, G5, G6, G7, G8) are arranged, as shown in FIG. 2. The process unit groups (G2, G4, G6, G8) are arranged at the front of the system, as shown in FIG. 3 (in the foreground in FIG. 2). The process unit groups (G1, G3, G5, G7) are arranged at the rear of the system, as shown in FIG. 4. The number and position of the process unit groups can be changed appropriately, if necessary.

As shown in FIG. 3, in the process unit groups (G2, G4, G6, G8), two spinner-type process units, in which a predetermined process is applied to a wafer W mounted on a spin chuck in a cup CP, are used. For example, a developing unit (DEV) are superposed on a resist coating unit (COT). The resist coating unit (COT) is preferably positioned at the lower stage as shown in the figure since discharge of the resist solution is troublesome in view of construction and maintenance. However, if necessary, the COT may be positioned at the upper stage.

As shown in FIG. 4, in the first process unit group G1, oven-type process units, in which a predetermined process is applied to the wafer W mounted on the table SP, are used. For example, a cooling unit (COL) for performing cooling process, an alignment unit (ALIM) for aligning, a pre-baking unit (PREBAKE) for performing heating before light exposure, and a post-baking unit (POBAKE) for performing heating after the light exposure are superposed in that order from the bottom. In the third process unit group G3, oven-type process units are used; for example, a cooling unit (COL) for applying a cooling process, an adhesion unit (AD) for rendering the wafer surface hydrophobic in order to improve resist-deposition, a pre-baking unit (PREBAKE) and a post-baking unit (POBAKE) are superposed in that order from the bottom. In the fifth and seventh process units (G5, G7), a cooling unit (COL) for performing cooling process, an extension cooling unit (EXTCOL), a pre-baking unit (PREBAKE) and a post-baking unit (POBAKE) are superposed in that order from the bottom.

Since the process units in which processes are performed at low temperatures, such as the cooling unit (COL) and the extension unit (EXTCOL), are placed in the lower stages and the process units in which processes are performed at high temperatures, such as the pre-baking unit (PREBAKE), the post-baking unit (POBAKE), and the adhesion unit (AD), are placed in the higher stages, thermal interference between units can be reduced. However, the process units may be arranged at random, if necessary.

The interface portion 12 has the same depth (X direction) as the process station 11 but shorter width than the process station 11. In the front portion of the interface portion 12, a movable pick-up cassette CR and a fixed buffer cassette BR are arranged one on top of the other. On the other hand, in the rear portion, the periphery light-exposure apparatus 23 is disposed. A wafer transfer member 24 is positioned in the middle. Since the wafer transfer member 24 moves in the X direction and the Y direction, it can access cassettes (CR, BR) and the periphery light-exposure apparatus 23. The wafer transfer member 24 can be rotated in the 0 direction, so that it can access both the wafer transfer member 22 of the process station 11 and the wafer transfer stage (not shown) provided on the side of the adjacent periphery light-exposure apparatus.

Figure 6:
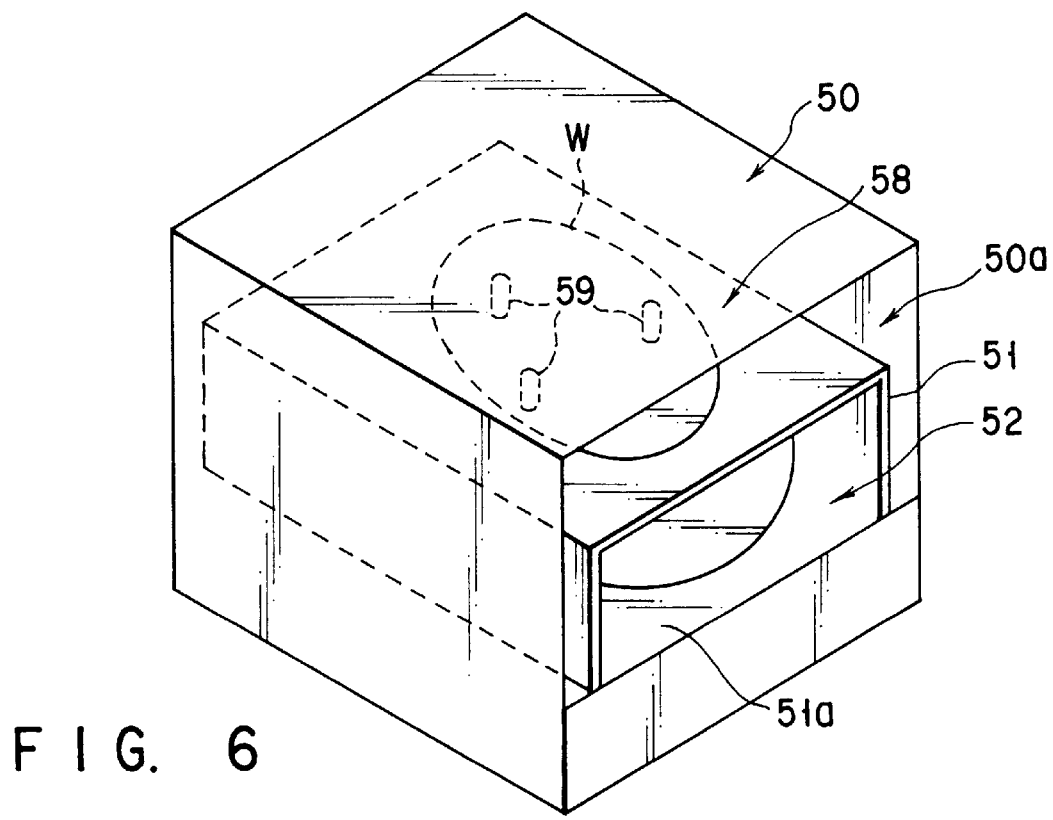
FIG. 6 is a perspective view of a cooling unit (COL) of the coating/developing process system shown in FIG. 2.

FIGS. 6 to 8 show the structure of the cooling unit (COL) according to the present invention. FIG. 6 is a perspective view. FIGS. 7 and 8 are longitudinal sectional views.

The process chamber 50 of the cooling unit (COL) has an opening 50a in the front. A cooling process portion 52 is placed within the process chamber 50. The cooling process portion 52 is provided with a covering member 51 in order to prevent the invasion of particles. In the front of the covering member 51, an opening 51a is provided. The wafer is loaded and unloaded through the opening 51a. In the center of the cooling process portion 52, a circular opening 53 is formed as shown in FIGS. 7 and 8. Within the opening 53, a circular cooling board 54 is provided as a stage. The circular cooling board 54 is cooled by an inert gas such as $N_2$, Ar, or He. On the outer periphery of the cooling board 54, a number of air holes 57 are formed circumferentially. From the air holes 57, the aforementioned inert gas for cooling is applied to the wafer W mounted on the cooling board 54.

The cooling board 54 has, for example, three holes 55. In each of the holes 55, a support pin 56 is movably inserted. When the wafer W is loaded/unloaded, the support pin 56 projects upwardly from the surface of the cooling board 54, as shown in FIG. 7. In this manner, the wafer W is transferred to the wafer transfer member 22. On the other hand, when the wafer is cooled, support pins 56 are descended from the surface of the cooling board 54, as shown in FIG. 8. In this manner, the wafer w is mounted on the surface of the cooling board 54. The wafer W mounted on the cooling board 54 is cooled by the cooling board 54 and the inert gas (cooling gas) supplied through the air holes 57. The temperature of the cooling board 54 and the cooling gas (inert gas) supplied from the air holes 57 are controlled, by means of a control unit constituted of a computer (not shown). The temperature of the wafer W is set at, for example, about 23° C. The cooling temperature may be appropriately set at a desired temperature.

On the upper surface 51c of the cover member 51, a siding portion 58 is provided for keeping the wafer W temporarily before being subjected to the cooling process portion 52. Since the siding portion 58 is formed on the upper surface of the cover member 51 (for preventing particles from entering the cooling portion 52) in this embodiment, the structure of the cooling unit can be simplified. The siding portion 58 is formed of a plurality, for example, three, of support pins 59 for supporting the wafer W (for waiting the cooling process), on the upper surface 51c of the cover member 51. In the upper portion of the siding portion 58, for example, on the ceiling of the process chamber 50, blow-out holes 60 are provided for blowing out the inert gas for cooling such as $N_2$, Ar or He. The inert gas for cooling supplied from the blow-out holes 60 is supplied by branching the inert gas used in the cooling process portion 52. The inert gas for cooling is supplied from the blow-out holes 60 and applied to the wafer W placed in the siding portion. In this manner, the wafer W in the siding portion 58 is actively cooled, with the result that the wafer W is relatively cool even before being loaded into the cooling process portion 52. By virtue of this, the cooling time of the wafer W in the cooling process portion 52 can be shortened. It should be noted that the blow-out holes 60 may also be provided on the wall of the process chamber 50.

The coating/developing system 1 according to this embodiment is constructed as mentioned above. Hereinbelow, we will explain how to transfer the wafer W in the coating/developing process system 1. First of all, in the cassette station 10, the wafer transfer member 21 accesses a cassette CR (containing unprocessed wafers) mounted on the cassette stage 20 and takes out a single wafer W from the cassette CR. The wafer transfer member 21 then transfers the wafer W to the wafer transfer member 22 of the process station 11. The transfer member 22 moves to the alignment unit (ALIM) positioned in the first process unit group G1. Then, the wafer W is loaded into the alignment unit (ALIM).

After orientation flat alignment and centering are completed in the alignment unit (ALIM), the wafer transfer member 2 receives the aligned wafer and moves to the front of the adhesion unit (AD) of the third process unit group G3, and then loads the wafer W into the unit. Subsequently, the wafer W is transferred to any one of the cooling units (COL). In the cooling unit (COL), the wafer W is cooled to a predetermined temperature (prior to resist coating), for example, 23° C.

After completion of the cooling process, the wafer W is unloaded from the cooling unit (COL) and loaded into any one of the resist coating units (COT) by the wafer transfer member 22. In the resist coating unit (COT), a resist solution is applied to the wafer surface in a uniform thickness by a spin-coat method.

After the resist-coating, the wafer W is unloaded from the resist coating unit (COT) and loaded into any one of the pre-baking units by the wafer transfer member 22. In the pre-baking unit, the wafer W is heated to a predetermined temperature, for example, 100° C., for a predetermined time. In this manner, remaining solvent is vaporized and removed from the coating film of the wafer W.

After the pre-baking process, the wafer W is unloaded from the pre-baking unit (PREBAKE) and loaded into the extension cooling unit (EXTCOL), one of the multiple units of the fifth or seventh process unit group (G5, G7), by the wafer transfer member 22. In the extension cooling unit (EXTCOL), the wafer W is cooled to a temperature, for example, 24° C., suitable for the next process, namely, periphery light exposure process performed by the periphery light exposure apparatus 23. After cooling is completed, the wafer W is transferred to the wafer transfer member 24 of the interface portion 12. Thereafter, the wafer W is loaded into the periphery light-exposure apparatus 23 in the interface portion 12 by the wafer transfer member 24. The periphery of the wafer W is exposed to light.

After the periphery light-exposure process is completed, the wafer W is unloaded from the periphery light-exposure apparatus 23 and transferred to the wafer receiving stage (not shown) of the adjacent light-exposure apparatus. Before being transferred to the light exposure apparatus, it may be necessary, in some cases, to temporarily store the wafer W in the buffer cassette B.

After the light exposure pattern is formed over the entire surface of the wafer W by the light-exposure apparatus, the wafer W is returned to the wafer receiving stage of the light-exposure apparatus. The wafer transfer member 24 of the interface portion 12 accesses the wafer receiving stage, receives the wafer W exposed to light, and passes it to the wafer transfer member 22 of the process station 11. In this case, before being transferred to the process station 11, the wafer W may be temporarily stored in the buffer cassette BR in the interface portion 12, when necessary.

The wafer W received by the wafer transfer member 22 is loaded into any one of the developing units (DEV). In the developing unit (DEV), the wafer W is mounted on the spin chuck. Then, a developing solution is uniformly sprayed over the wafer surface. After the resist is removed from the periphery of the wafer which has been exposed to light and developed, a rinse solution is applied to the wafer surface to wash off the developing solution. After the developing process, the wafer W is unloaded from the developing unit (DEV) and loaded into any one of the post-baking units (POBAKE). In the post-baking unit (POBAKE), the wafer is heated to 100° C. for a predetermined time. By the post-baking, the resist, which has been swollen by the developing solution, is cured. The chemical resistance is thereby improved.

After the post-baking process, the wafer W is unloaded from the post-baking unit (POBAKE) and loaded into any one of the cooling units (COL). When the temperature of the wafer is returned to normal, the wafer transfer member 22 transfers the wafer W to the wafer transfer member 21 of the cassette station 10. The wafer received by the wafer transfer member 21 is introduced into a predetermined wafer groove of the cassette CR (for process-completed wafer) on the cassette stage 20.

In some cases, in the resist coating/developing process mentioned above, a number of wafers requiring the cooling process assemble at the cooling process portion 52 and wait for subjection to the process. A siding portion is therefore devised in the coating/developing process system 1 of this embodiment. The wafers waiting for their turn at the cooling process are temporarily placed in the siding portion 58 formed in the cooling unit (COL). The operation of the wafer will be described below more specifically.

Figure 9:
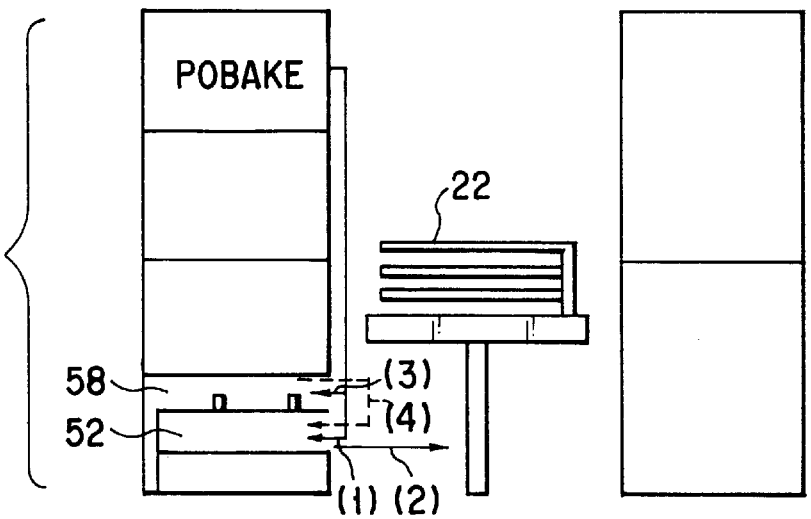
FIG. 9 is a view for use in explaining how to operate the wafer transfer member when a wafer is loaded to or unloaded from the cooling unit (COL) of the process station shown in FIG. 2.

As shown in FIG. 9, after completion of the post-baking, the wafer W is unloaded from the post-baking unit (POBAKE) and loaded into the cooling unit (COL). At this time, if any one of the cooling units (COL) is vacant, the wafer W after the post-baking is loaded into the cooling process portion 52 and the cooling process is performed (FIG. 9, (1)). After the cooling process, the wafer W is taken out from the cooling process portion 52 and transferred to the next step (FIG. 9, (2)). If the cooling process portion of any one of the cooling units (COL) is occupied, the wafer after the post-baking is temporarily stored in a siding portion 58 (FIG. 9, (3)). Thereafter, when any one of the cooling process portions 52 becomes vacant, the wafer W is loaded into the vacant cooling process portion 52 and the cooling process is performed (FIG. 9, (4)). After the completion of the cooling process, the wafer W is taken out from the cooling process portion 52 and transferred to the next step (FIG. 9, (2)).

When the wafer W is loaded in the cooling unit (COL) after the post-baking is completed, if there is no vacant room in the cooling process portion of any one of the cooling units (COL), the wafer W is temporarily stored in the siding portion 58 in the coating/developing process system 1 according to this embodiment. Hence, it is not necessary to leave the wafer in the post-baking unit (POBAKE) or in the wafer transfer member 22 while waiting to undergo the cooling process. By virtue of this, there are no adverse effect on the wafer W and the throughput will not decrease. It is not necessary to increase the number of the cooling unit (COL), a space cost is suppressed.

In the coating/developing process system 1 according to this embodiment, a different pair of tweezers is used when the wafer W is transferred to the cooling process by the wafer transfer member 22, when the wafer W is transferred from the cooling process to another process, and when the wafer W is transferred from the siding portion 58 to the cooling process portion 52, as explained with reference to FIG. 5. We will explain the reasons why the three pairs of tweezers are used separately, with reference to FIGS. 10 to 14.

Figure 10:
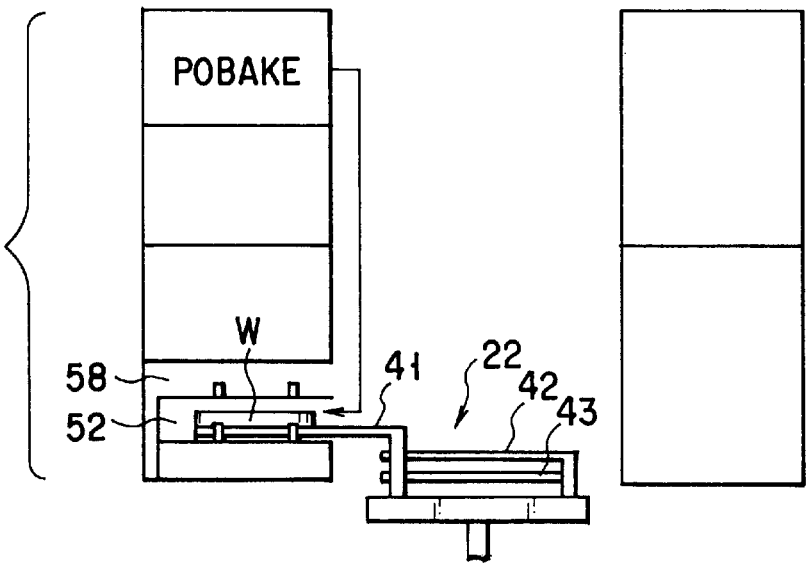
FIG. 10 is a view for use in explaining how to operate a pair of tweezers of the wafer transfer member when the wafer is loaded to or unloaded from the cooling unit (COL) of the process station shown in FIG. 2.
Figure 11:
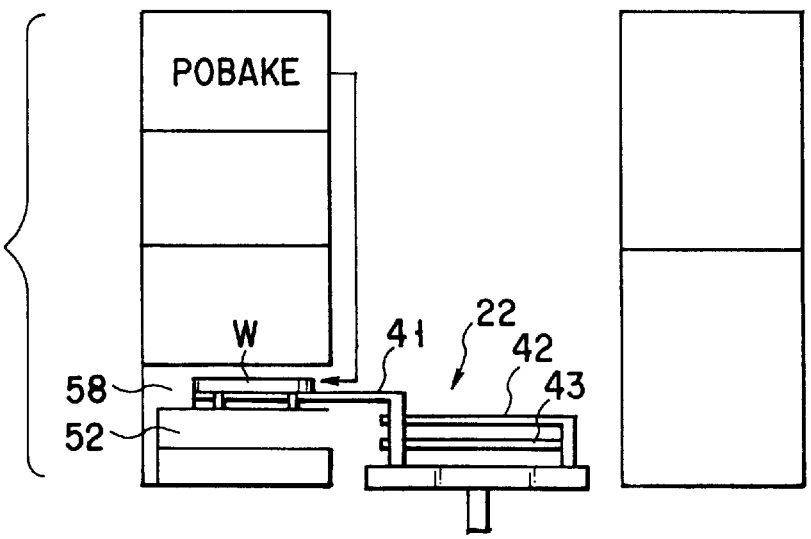
FIG. 11 is another view for use in explaining how to operate a pair of tweezers of the wafer transfer member when the wafer is loaded to or unloaded from the cooling unit (COL) of the process station shown in FIG. 2.

When the wafer W is transferred from the post-baking unit (POBAKE) to the cooling unit (COL) by the wafer transfer member 22 after completion of the post-baking, the wafer W is directly loaded into the cooling process portion 52 if the portion 52 of any one of the cooling units is vacant. In this case, the wafer is transferred by use of the uppermost pair of tweezers 41 of the wafer transfer member 22, as shown in FIG. 10. When the cooling process portion 52 of any one of the cooling units (COL) is occupied, the wafer W is temporarily stored in the siding portion 58. In this case, the wafer W is transferred to the siding portion 58 also by use of the uppermost pair of tweezers 41 of the wafer transfer member 22, as shown in FIG. 11

Figure 12:
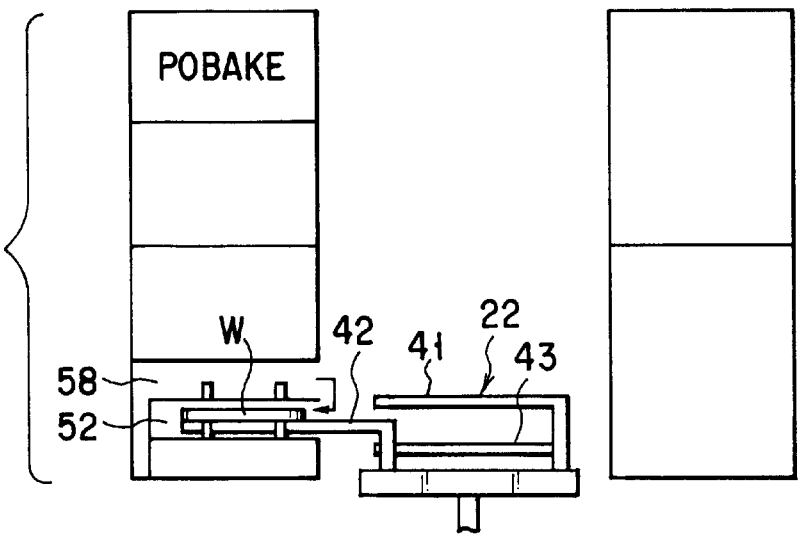
FIG. 12 is still another view for use in explaining how to operate a pair of tweezers of the wafer transfer member when the wafer is loaded to or unloaded from the cooling unit (COL) of the process station shown in FIG. 2.

On the other hand, when the cooling process portion 52 becomes vacant, the wafer W is transferred from the siding portion 58 into the cooling process portion 52 by use of the second-stage tweezers 42 of the wafer transfer member 22, as shown in FIG. 12.

Figure 13:
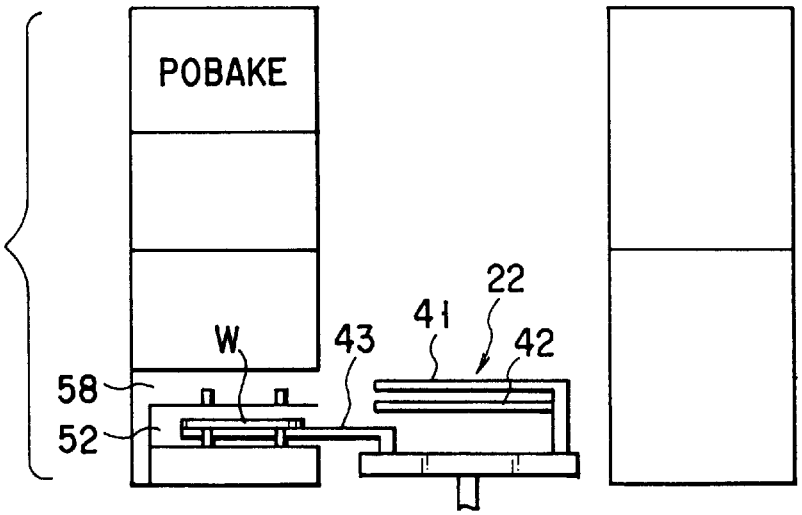
FIG. 13 is a further view for use in explaining how to operate a pair of tweezers of the wafer transfer member when the wafer is loaded to or unloaded from the cooling unit (COL) of the process station shown in FIG. 2.

When the wafer W is transferred from the cooling process portion 52 to the next process unit by the wafer transfer member 22 after the cooling process is completed. In this case, the wafer W is transferred by use of the lowermost pair of tweezers 43 of the wafer transfer member 22, from the cooling process portion 52 to the next process unit, as shown in FIG. 13.

Figure 14:
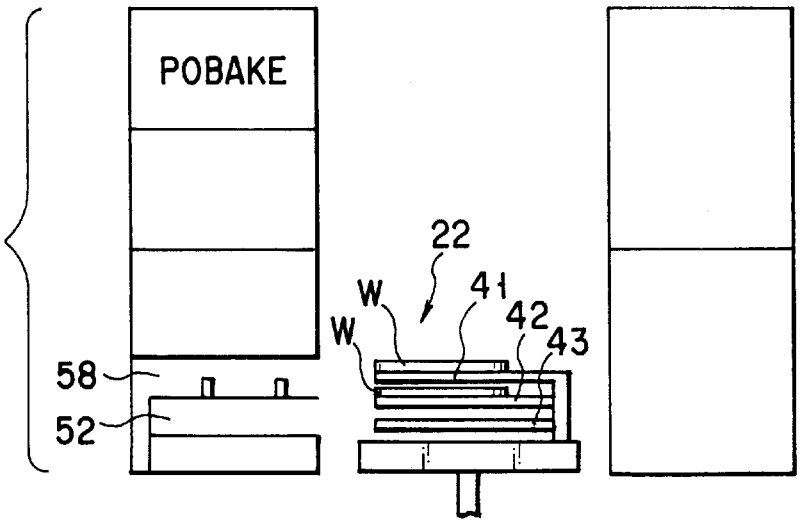
FIG. 14 is a view for use in explaining advantages of the operation of a pair of tweezers of the wafer transfer member when the wafer is loaded to or unloaded from the cooling unit (COL) of the process station shown in FIG. 2.

As described above, since three types of tweezers of the wafer transfer member 22 are used separately depending on the temperature of the wafer W in the coating/developing process system 1 according to this embodiment, (for example, the uppermost pair of tweezers is used when temperature of the wafer is high and lower-positioned pair of tweezers is used when temperature of the wafer is low), the system 1 is free from adverse effects brought by thermal interference between wafers W when at least two wafers are coincidentally overlapped at the wafer transfer member 22, as shown in FIG. 14.

The present invention is not limited to the aforementioned embodiment and may be modified in various ways within the technical idea.

Figure 16:
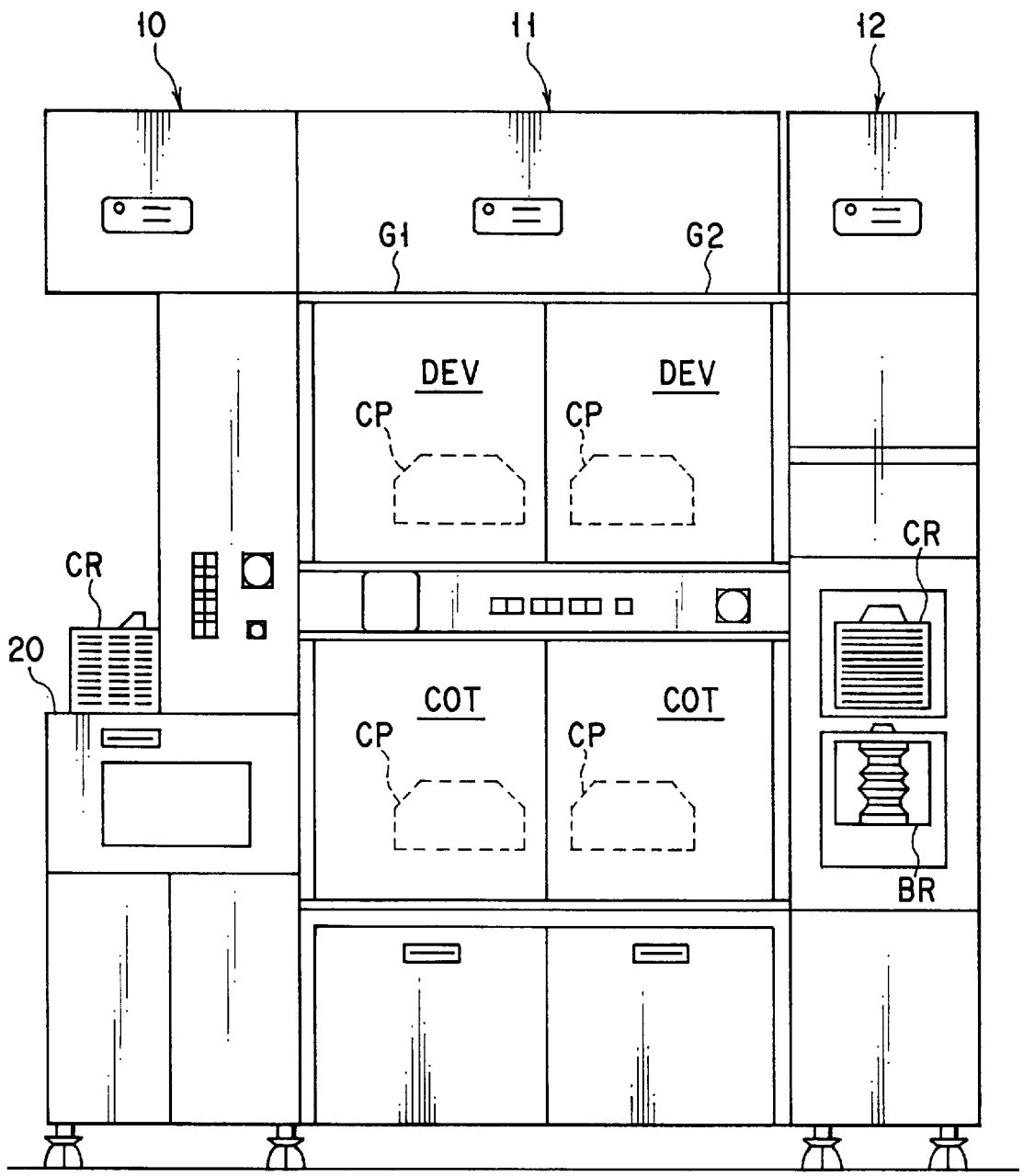
FIG. 16 is a front view of the coating/developing process system shown in FIG. 15.
Figure 17:
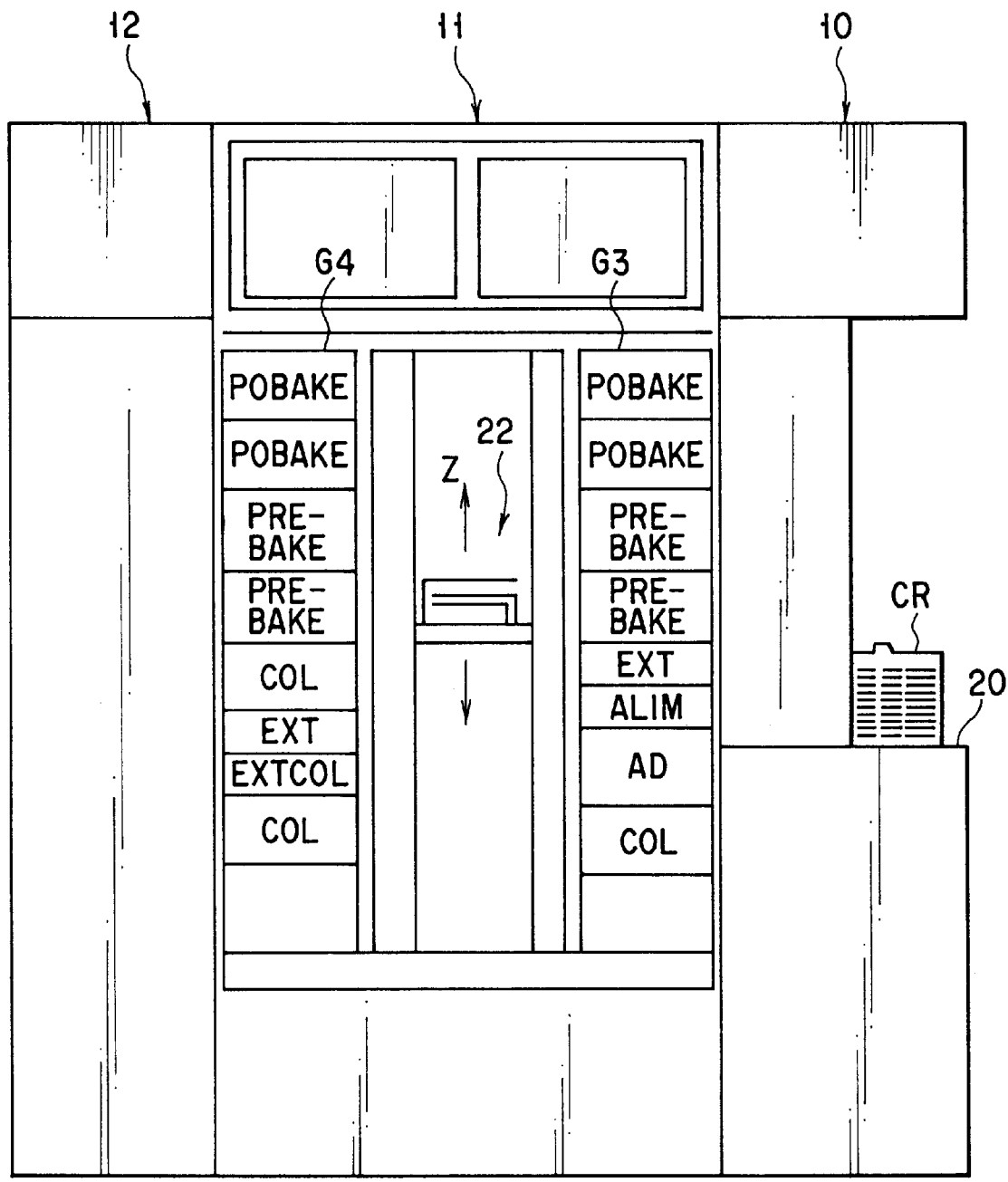
FIG. 17 is a rear view of the coating/developing process system shown in FIG. 15.

To be more specific, in the process station 11 mentioned above, process unit groups are arranged in both sides of the transfer path for the wafer transfer member 22. However, the wafer transfer member 22 vertically movable in the Z direction and rotatable in the θ direction may be provided in the virtually center of the process station 11 and all process units may be arranged around the wafer transfer member 22, as shown in FIGS. 15 to 17. In the embodiment shown in FIGS. 15 to 17, five process unit groups G1, G2, G3, G4, and G5 can be arranged. The multiple units of the first and second process unit groups (G1, G2) are positioned at the front of the system (foreground in FIG. 15). The multiple-stage unit of the third process unit group G3 is positioned next to the cassette station 10. The multiple-stage unit of the fourth process unit group G4 is positioned next to the interface portion 12. The multiple-stage unit of the fifth process unit group G5 can be placed at the rear. In this case, the third process unit group G3 has an extension unit (EXT) for transferring the wafer between the cassette station 10 and G3. The fourth process unit group G4 has an extension unit (EXT) for transferring the wafer between the interface portion 12 and G4.

In the former embodiment, the siding portion for storing the wafer W waiting its turn at the cooling unit (COL) is formed in the cooling unit (COL). However, the siding portion may be provided in the extension cooling unit (EXTCOL).

The number of pairs of tweezers may be two or at least four. When two pairs of tweezers are used, the uppermost pair of tweezers is used when the wafer W is transferred to the cooling process. The lowermost pair of tweezers is used when the wafer W is transferred from the cooling process to another process. One of the two pairs of tweezers may be used when the wafer W is transferred from the siding portion to the cooling process.

The embodiments of the present invention are concerned with the resist coating/developing process system used in the photolithographic step of manufacturing the semiconductor device. The present invention can be applied to another process system. The substrate to be processed is not limited to a semiconductor wafer and may be applied to an LCD substrate, glass substrate, CD substrate, photomask, printing substrate, ceramic substrate, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A cooling process system comprising:
    a cooling process portion for applying a cooling process to a substrate;
    a siding portion provided in an upper portion of said cooling process portion, for temporarily storing a substrate before being subjected to the cooling process; and
    a transfer mechanism for performing at least one of loading and unloading of said substrate with respect to said cooling process portion and said siding portion.

2. The cooling process system according to claim 1, wherein
    said transfer mechanism has a first holding member and a second holding member movable into and out of said cooling process portion and said siding portion,
    said first holding member loads said substrate into said cooling process portion, and said second holding member unloads said substrate from said cooling process portion.

3. The cooling process unit according to claim 2, wherein said first holding member is provided at upper position and said second holding member is provided at lower position.

4. The cooling process system according to claim 1, wherein said transfer mechanisms has a first holding member, a second holding member, and a third holding member movable into and out of said cooling process portion and said siding portion, said first holding member transfers said substrate to one said siding portion and said cooling process portion, said second holding member transfers said substrate from said siding portion to said cooling process portion, and said third holding member unloads said substrate from said cooling process portion.

5. The cooling process system according to claim 4, wherein said first holding member is provided at an upper position, said second at a middle position and said third at a lower position.

6. The cooling process system according to claim 1, wherein said transfer mechanism has a plurality of holding members movable into and out of said cooling process portion and said siding portion, an uppermost holding member transfers said substrate to said one of said siding portion and said cooling process portion, a lowermost holding member unloads said substrate from said cooling process portion, and a middle holding member transfers said substrate from said siding portion to said cooling process portion.

7. The cooling process system according to claim 1, wherein said cooling process portion responsible for applying cooling process to a heated substrate by use of an inert gas for cooling, and said inert gas for cooling used in said cooling process is branched and supplied to a substrate in said siding portion.

8. A cooling process system comprising:

a cooling process portion for applying a cooling process to a substrate;

a covering member for covering an upper portion of said cooling process portion;

a siding portion provided on the upper surface of said covering member, for temporarily storing said substrate before being subjected to the cooling process; and a transfer mechanism for at least one of loading and unloading said substrate with respect to said cooling process portion and said siding process.

9. The cooling process system according to claim 8, wherein said transfer mechanism has a first holding member and a second holding member movable into and out of said cooling process portion and said siding portion, said first holding member loads said substrate into said cooling process portion, and said second holding member unloads said substrate from said cooling process portion.

10. The cooling process system according to claim 9, wherein said first holding member is provided at upper position and said second holding member is provided at lower position.

11. The cooling process system according to claim 8, wherein said transfer mechanism has a first holding member, a second holding member, and a third holding member movable into and out of said cooling process portion and said siding portion, said first holding member transfers said substrate to said one of said siding portion and said cooling process portion, said second holding member transfers said substrate from said siding portion to said cooling process portion, and said third holding member unloads said substrate from said cooling process portion.

12. The cooling process system according to claim 11, wherein said first holding member is provided at an upper position, said second at a middle position and said third at a lower position.

13. The cooling process system according to claim 8, wherein said transfer mechanism has a plurality of holding members movable into and out of said cooling process portion and said siding portion, an uppermost holding member transfers said substrate to said one of said siding portion and said cooling process portion, a lowermost holding member unloads said substrate from said cooling process portion, and a middle holding member transfers said substrate from said siding portion to said cooling process portion.

14. The cooling process system according to claim 8, wherein said cooling process portion responsible for applying cooling process to a heated substrate by use of an inert gas for cooling, and said inert gas for cooling used in said cooling process is branched and supplied to a substrate in said siding portion.

* * * * *